United States Patent [19]

Sonobe et al.

[11] Patent Number: 5,402,381
[45] Date of Patent: Mar. 28, 1995

[54] SEMICONDUCTOR MEMORY CIRCUIT HAVING BIT CLEAR AND/OR REGISTER INITIALIZE FUNCTION

[75] Inventors: Satoru Sonobe; Hideo Abe, both of Tokyo, Japan

[73] Assignee: NEC Corporation, Tokyo, Japan

[21] Appl. No.: 894,434

[22] Filed: Jun. 5, 1992

[30] Foreign Application Priority Data

Jun. 6, 1991 [JP] Japan .................. 3-134539

[51] Int. Cl.$^6$ .................................. G11C 7/00
[52] U.S. Cl. ................ 365/218; 365/189.01; 365/188
[58] Field of Search ............. 365/154, 189.01, 189.05, 365/174, 203, 188, 218

[56] References Cited

U.S. PATENT DOCUMENTS

| | | | |
|---|---|---|---|
| 4,489,404 | 12/1984 | Yasuoka | 365/218 |
| 4,879,686 | 11/1989 | Suzuki et al. | 365/218 |

FOREIGN PATENT DOCUMENTS

| | | | |
|---|---|---|---|
| 57-176587 | 10/1982 | Japan | 365/218 |
| 58-54793 | 3/1983 | Japan | 365/218 |
| 61105793 | 10/1984 | Japan | 365/218 |
| 63177392 | 1/1987 | Japan | 365/218 |

*Primary Examiner*—Do Hyun Yoo
*Assistant Examiner*—Vu Le
*Attorney, Agent, or Firm*—Sughrue, Mion, Zinn, Macpeak & Seas

[57] ABSTRACT

A semiconductor memory circuit includes a plurality of memory cells arranged in an array form, a plurality of data lines for reading and writing data, a plurality of address lines each for transferring an address signal that specifies a corresponding specific memory cell, a control unit for controlling reading and writing of the data, a plurality of data input and data output terminals for inputting and outputting the data, a write enable signal input terminal to which a write enable signal for permitting writing of the data is applied, and at least one control signal input terminal to which either a cell clear signal for clearing the data stored or a cell initialization signal for performing the initialization of the data is applied. Data reading, data writing and data clearing or data initializing are performed through the plurality of data lines and the plurality of address lines. The hardware area to be occupied is reduced due to a reduction in the number of the cell transistors and also by a reduction in the number of signal lines.

4 Claims, 5 Drawing Sheets

SEMICONDUCTOR MEMORY CIRCUIT HAVING BIT CLEAR AND/OR REGISTER INITIALIZE FUNCTION

BACKGROUND OF THE INVENTION (1) Field of the Invention

The present invention relates to a semiconductor memory device and, more particularly, to a flag register for use in such as interrupt controllers and timers, which has a bit clear and a register initialization function.

(2) Description of the Related Art

Microcomputers are used in a wide range of fields, and the diversification of their functions and the improvement of their performance are being steadily advanced. It is desirable to make the occupied area of the unit on the semiconductor substrate and the number of transistors as small as possible, thereby reducing the price of such microcomputers.

Various kinds of flag registers are needed in the microcomputer to memorize the interrupt status and the interrupt control. Data memory cells are arranged in arrays in the flag register, and the flag register is generally provided with signal lines which perform the reading and writing of the data (hereinafter called "R/W data lines"), address lines each of which specifies a specific cell, a control unit which controls the data reading and the data writing (hereinafter called "R/W control unit"), and cell clear lines which perform the data clear.

Figure 1A:
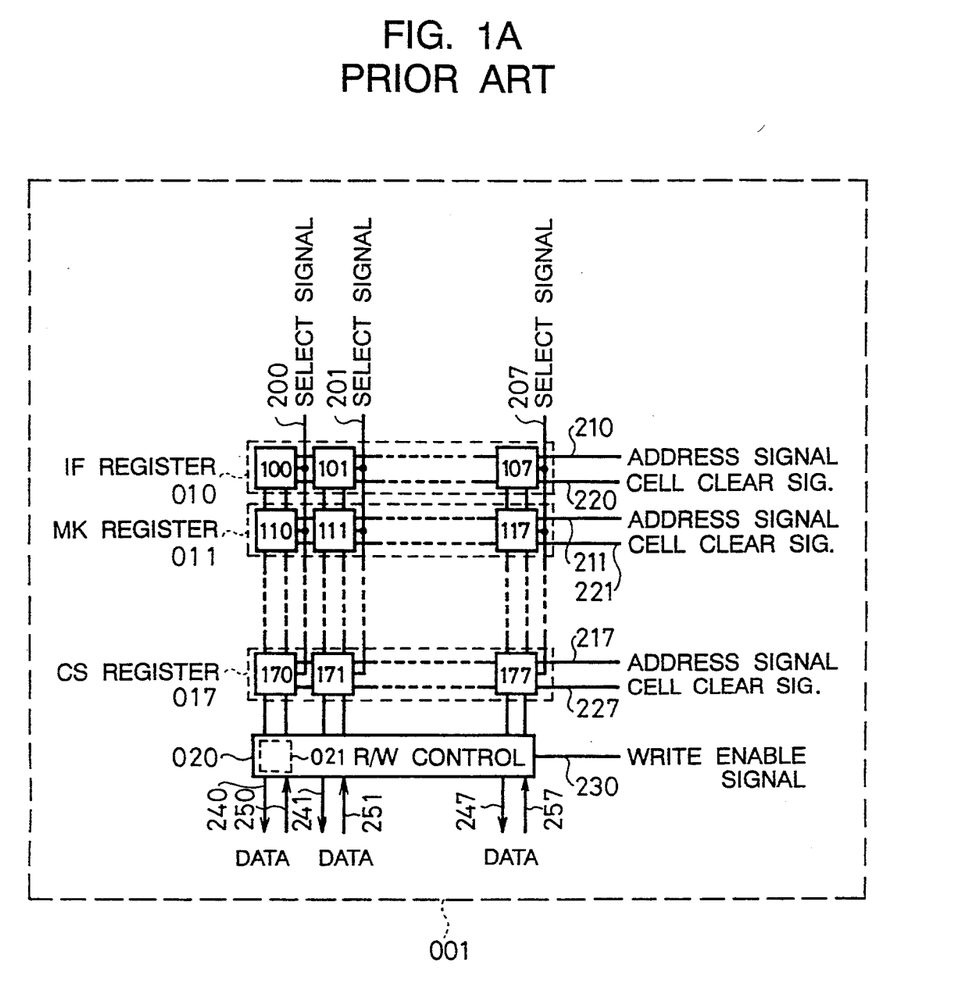
FIG. 1A is a block diagram of a conventional flag register.
Figure 1B:
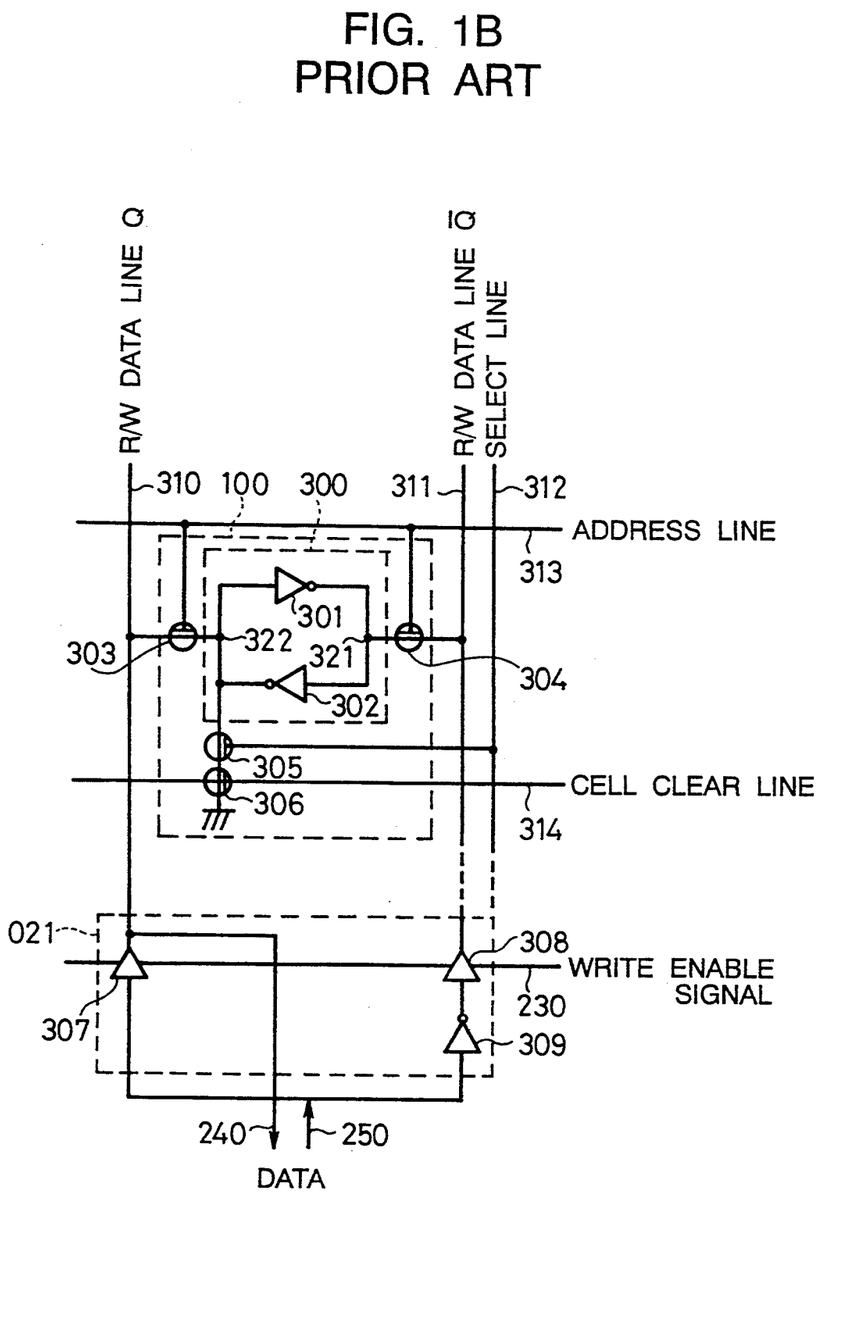
FIG. 1B is a detailed circuit diagram of a cell and an R/W control unit in the flag register shown in FIG. 1A.

FIGS. 1A and 1B show such conventional flag register to which the present invention relates and which is used in the interrupt controller.

A flag register 001 shown in FIG. 1A comprises: an R/W control unit 020 which controls the data read and the data write, and eight sets of registers such as a register 010 which indicates the interrupt receive status (hereinafter called "IF register"), a register 011 which indicates the enable or disable of the interrupt receiving (hereinafter called "MK register"), and a register 017 which indicates the interrupt processing method (hereinafter called "CS register"). Each of the registers has eight memory cells that memorize the data corresponding to the eight types of interrupt causes. To these registers, a plurality of address signals 210~217 are inputted to specify a register which is subjected to the data read and the data write. Also, a plurality of cell clear signals 220~227 and a plurality of select signals 200~207 are inputted to specify the cells from which the data are to be cleared. The R/W control unit 020 has input terminals 250~257 for inputting the data and output terminals 240~247 for outputting the data. The R/W control circuit 020 also receives a write enable signal 230 which indicates data write permission.

Next, the detailed structure of one of the cells of the flag register 001 and a part 021 of the R/W control unit 020 of FIG. 1A is shown in FIG. 1B. The cell 100 comprises: a latch 300 which memorizes the data and which is formed by two inverters 301 and 302 each for inverting the logic value of the data; two transistors 303 and 304 which are used for the data read and the data write; and two transistors 305 and 306 which are used for the data clear. In the cell, the data is memorized in an output line 322 of the inverter 302, and its inverted data is memorized in an output line 321 of the inverter 301. The output lines 322 and 321 are connected through the transistor 303 to the R/W data line Q 310, and through the transistor 304 to the R/W data line $\overline{Q}$ 311, respectively. The transistors 303 and 304 perform connection and disconnection of the latch 300 to the R/W data lines 310 and 311 in such a way that, when the signal of the address line 313 is "1", they perform a connection, and when the same is "0", they perform a disconnection. The R/W data lines 310 and 311 are connected to clocked buffers 307 and 308 which are controlled by the write enable signal 230. An input terminal of the clocked buffer 307 is connected directly to the input terminal, and that of the clocked buffer 308 is connected through an inverter 309 to the data input terminal 250. Also, the R/W data line Q 310 is connected directly to the data output terminal 240.

The actual operation of the flag register 001 shown in FIG. 1A is explained below with reference to FIG. 1B. In the case of reading-out of the data, the selection of one of the registers can be effected by making one of the address signals 210~217 "1" and the rest of the address signals "0" and, thus, the data stored in the selected register are read out simultaneously from the output terminals 240~247. In the case of writing of the data, a register can be selected using the address signals 210~217, and setting the write enable signal 230 to "1". With the write enable signal 230 being set to "1", the clocked buffers 307 and 308 are operated so as to output the input data to the R/W data line Q 310 and to output the input data inverted by the inverter 309 to the R/W data line $\overline{Q}$ 311, whereby the data stored in the register are renewed (written over) at the same time. In the case of clearing of the data, the register(s) can be specified by setting the level of the cell clear signal(s) 220~227 to "1", and the bit(s) can be specified by setting the level of the select signal(s) 200~207 to "1". In the cells in which the levels of both the cell clear signal and the select signal are "1", because the transistors 305 and 308 connected in series become conductive, the potential at the output line 322 of the inverter 302 assumes the same potential as the ground level that is at a logic level "0", whereby the data of the cell is cleared to "0". In the case of initializing of the data, one register is selected by the address signals 210~217 in the same manner as in the data writing operation, and the initial data are written therein, thereby completing the initialization of the particular one register. By selecting all of the registers in succession using the address signals 210~217, and performing a similar operation, the initialization of all the registers can be completed.

In the conventional flag register as explained above, two R/W data lines, an address line, a cell clear signal line, and a select signal line must be provided for each cell. Also, each of the cells requires a circuit for cell clear or cell initialize operations. In this kind of circuit configuration, the realization of the flag register with a small amount of hardware area was difficult. This is a problem to be solved by the invention in the conventional flag register.

SUMMARY OF THE INVENTION

It is, therefore, an object of the invention to overcome the problems existing in the conventional flag register and to provide an improved flag register in which the data clear and the data initialization can be performed easily and which requires a small amount of hardware area.

According to one aspect of the invention, there is provided a semiconductor memory circuit comprising:

a plurality of registers each having a plurality of memory cells arranged in an array form;

a plurality of data lines for reading data from and writing data in the plurality of memory cells;

a plurality of address lines which are connected respectively to the plurality of memory cells in the plurality of registers, each of the plurality of address lines being for transferring an address signal for specifying a corresponding specific memory cell in each of the register;

a control unit which controls reading and writing of the data in the plurality of memory cells;

a plurality of data input and data output terminals which input and output the data to the control unit;

a write enable signal input terminal which is connected to the control unit and to which a write enable signal for permitting writing of the data is applied; and at least one control signal input terminal to which either a cell clear signal for clearing the data stored in the memory cell or a cell initialization signal for performing the initialization of the data in the memory cell is applied.

whereby data reading, data writing and data clearing or data initializing are performed through the plurality of data lines and the plurality of address lines.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, some preferred embodiments of the invention will be explained hereunder with reference to the accompanying drawings.

Figure 2A:
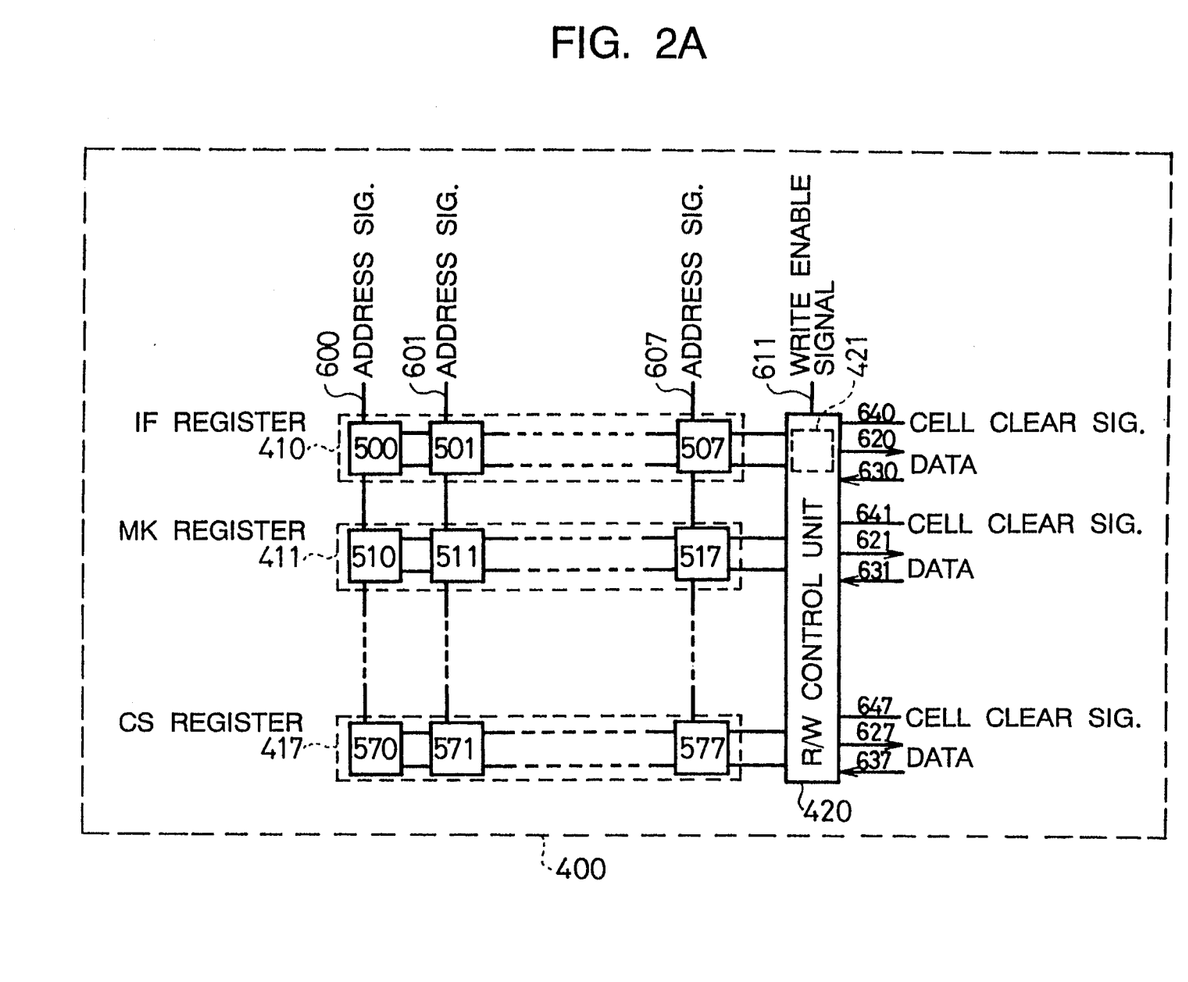
FIG. 2A is a block diagram of a flag register of a first embodiment according to the present invention.
Figure 2B:
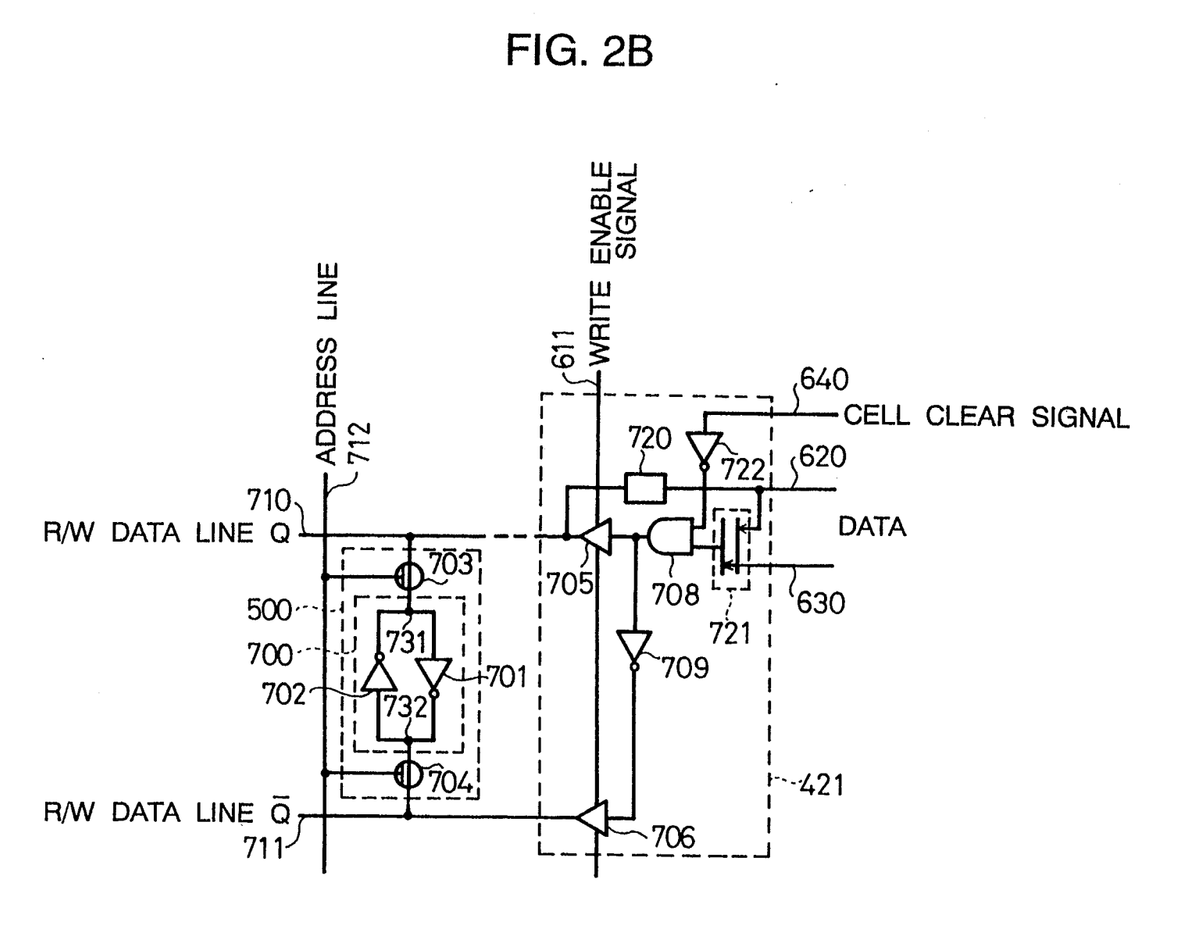
FIG. 2B is a detailed circuit diagram of the cell and the R/W control unit in the flag register shown in FIG. 2A.

FIG. 2A shows in a block diagram a flag register used in an interrupt control unit, as a first embodiment according to the invention, and FIG. 2B shows in detail a cell and an R/W control unit in the flag register shown in FIG. 2A.

A flag register 400 of the invention comprises eight sets of registers such as an IF register 410, an MK register 411 and a CS register 417, and an R/W control unit 420 which performs the controlling of the data reading and the data writing. To specify a register which is subjected to the data read/write operation, address signals 600~607 are inputted to the registers. The R/W control unit 420 has input terminals 630~637 for inputting the data and output terminals 620~627 for outputting the data. The R/W control unit 420 receives a write enable signal 611 which indicates the data write enable state, and cell clear signals 640~647 which are for clearing the respective registers.

FIG. 2B shows a detailed circuit structure of one cell 500 in the flag register 400 and of a part 421 of the R/W control unit 420.

The cell 500 comprises a latch 700 which is formed by two inverters 701, 702, and two transistors 703, 704 which are used for the data read and the data write. The part 421 of the R/W control unit 420 comprises two clocked buffers 705, 708; two inverters 709, 722; a latch 720; an AND gate 708; and a selector 721.

In the cell 500, the data and its inverted data are stored at an output line 731 of the inverter 702 and an output line 732 of the inverter 701, respectively. The output line 731 is connected to the R/W data line Q 710 through the transistor 703, and the output line 732 is connected to the R/W data line $\overline{Q}$ 711 through the transistor 704. The transistors 703 and 704 perform the connection and disconnection between the latch 500 and the R/W data lines 710 and 711. When the signal on the address line 712 is "1", the connection is performed, and when the same is "0", the disconnection is performed. The R/W data lines 710 and 711 are connected to output terminals of the clocked buffers 705 and 708, respectively, which are controlled by the write enable signal 611. An output terminal of the AND gate 708 is connected directly to an input terminal of the clocked buffer 705, and through the inverter 709 to an input terminal of the clocked buffer 706. To the AND gate 708 are inputted an output of the inverter 722 which inverts the logic of the cell clear signal 640 and an output of the selector 721. An output terminal of the latch 720 and the data input line 630 are connected to input terminals of the selector 721. The latch 720 takesin the data from the R/W data line Q 710, and outputs the data to the output terminal 620.

Next, the actual operation of the flag register 400 shown in FIG. 2A is explained hereunder with reference to FIG. 2B.

In this embodiment, unlike in the conventional flag register, it should be noted that the data read/write operation is performed on the cell, as a unit, corresponding to the cause of interruption in the register, instead of being performed on the register as a unit, such as the IF register 410, the MK register 411 and the CS register 417.

In the case of the data read-out, the 1 bit in each register can be selected by setting one of the address signals 600~607 to "1" and the rest of the address signals to "0", and then the read-out data is outputted from each of the data output terminals 620~627 simultaneously with the read-out data being latched in the latch 720. Because the data latching into the data latch 720 is constantly performed, the latest data of the bit selected by the address signal is latched in the latch 720.

The data write also serves the data clear function. In the case of the data write or the data clear, the 1 bit of each register is selected by the address signals 600~607, and the write enable singal 611 is set to "1". When the write enable signal 611 becomes "1", the clocked buffers 705 and 706 are operated such that the output of the AND gate 708 is outputted to the R/W data line Q 710 and the output of the AND gate 708, which has been inverted by the inverter 709, is outputted to the R/W data line $\overline{Q}$ 711. Whereby the data in the bits of the respective registers are replaced or renewed at the same time. In the case of the data write, the selector 721 selects the data from the data input terminal 630 and, because the output of the inverter 722 is "1", the output of the AND gate 708 becomes the input data supplied to the input terminal 630.

In the case of the data clear, by setting the cell clear signals corresponding to the registers to be cleared chosen from the cell clear signals 640~647 to "1" and the remaining cell clear signals to "0", the selector 721 is so controlled that it outputs the output of the latch 720. When the cell clear signal 640 is "1", the output of the inverter 722 is "0", and because the output of the AND gate 708 becomes "0", the specified bit is cleared. However, in the register where the cell clear signal 640 is "0", because the output of the AND gate 708 becomes the same value as the output of the latch 720, the value of the specified bit does not change. In this way, in this embodiment, because the data read/write and the data clear are performed using the same lines, the cell clear line 314 and the select line 312 (shown in FIG. 1B) that were needed in the conventional flag register are no longer needed. Also, the two transistors 305 and 308 (shown in FIG. 1B) that were required in each cell for the purposes of the data clear and the data initializing operations are no longer needed. Therefore, in the conventional cell 100, a total of ten transistors were required, but the cell 500 of this embodiment only requires a total of eight transistors.

Figure 3:
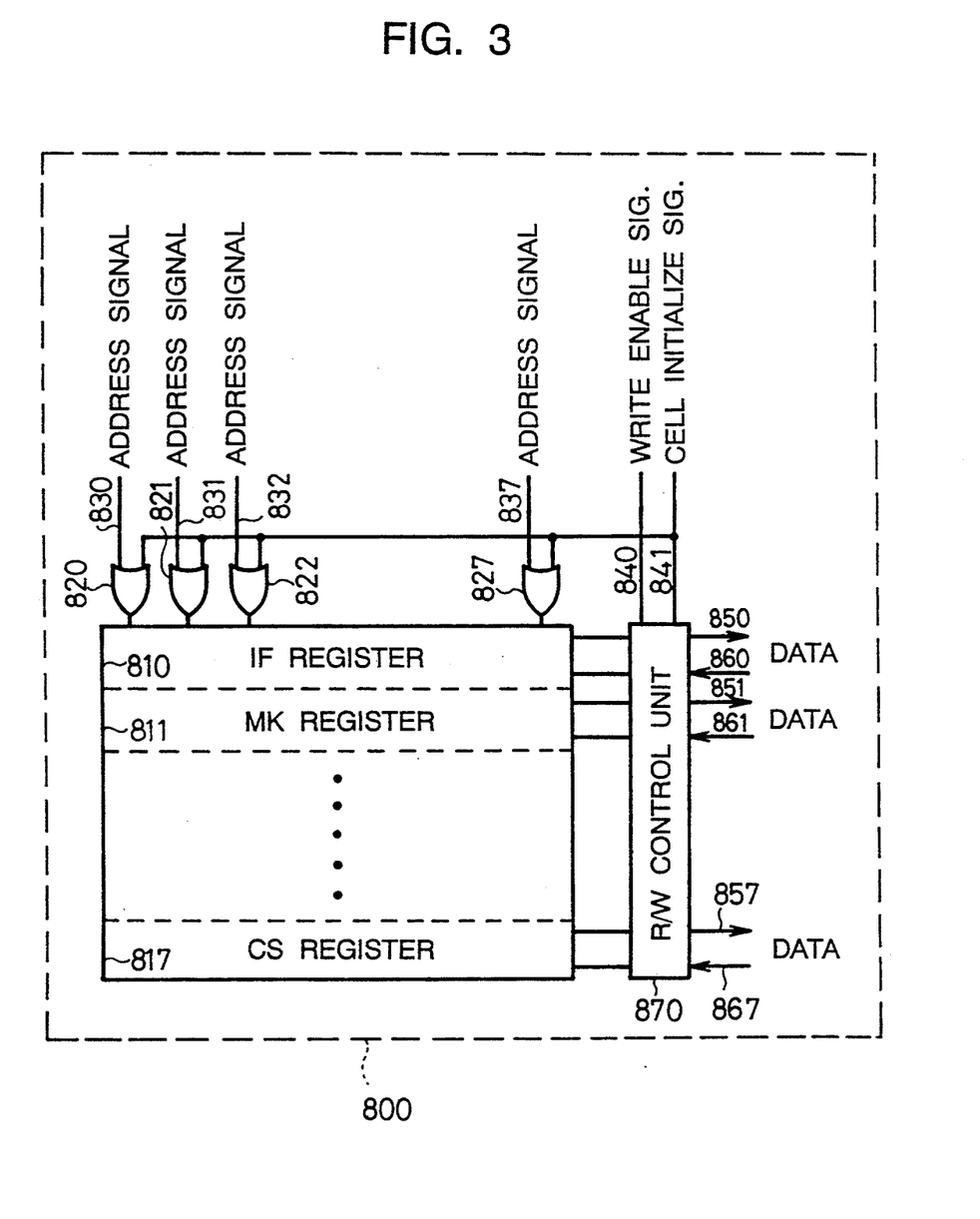
FIG. 3 is a block diagram of a flag register of a second embodiment according to the present invention.

Next, FIG. 3 shows a flag register 800 of another embodiment of the invention, which is used in the interrupt control unit. This flag register 800 has such function that it places the data in each of the registers in the initialized state.

The circuit configuration of the flag register 800 is almost the same as that of the above explained first embodiment. Specifically, it comprises a plurality of registers such as an IF register 810, an MK register 811 and a CS register 817, and an R/W control unit 870 which performs the controlling of the data read/write. This second embodiment differs from the first embodiment in that, for the purpose of initialization of the registers, it is provided with a plurality of OR gates 820~827 in the same number of bits of the register. To these OR gates 820~827, address signals 830~837 each for specifying a specific bit in each of the registers are respectively inputted and a cell initialization signal 841 is commonly inputted. A write enable signal 840 and the cell initialization signal 841 are inputted to the R/W control unit 870, and the data are inputted through the input terminals 860~867 and they are outputted through the output terminals 850~857.

Now, a brief explanation of the actual operation of the above flag register 800 is given below. The data read/write is performed in the same way as in the first embodiment. In the case of the initialization of the registers, an initial value for each register is set at each of the data input terminals 860~867, and then the cell initialization signal 841 is set to "1". As a result, because all the outputs of the OR gates 820~827 become "1" irrespective of the respective values of the address signals 830~837, all the bits of the registers are selected and the initial values having been set at the data input terminals 860~867 are written in the respective registers through the R/W control unit 870. In this way, since all the bits in the respective registers are initialized at the same time, there is no need to specify the bits in the registers successively with the use of a software to perform the necessary initialization.

As has been explained hereinabove, in the flag register of this invention, since the data lines, the cell clear lines and the cell initialization lines are commonly used, the occupied hardware area is reduced by 20% due to the reduction in the number of the cell transistors, and is further reduced by a reduction in the number of signal lines. Especially, the hardware reduction rate increases as the number of registers or the number of bits in the register is increased. Further, this invention is advantageous in the simplification of the software relating to the initialization of the flag register.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor memory circuit comprising:

a plurality of registers each having a plurality of memory cells arranged in an array form;

a plurality of data lines for reading data from and writing data in said plurality of memory cells;

a plurality of address lines which are connected respectively to said plurality of memory cells in said plurality of registers, each of said plurality of address lines being for transferring an address signal for specifying a corresponding specific selectable memory cell in each of said registers;

a control unit which controls reading and writing of the data in said plurality of memory cells;

a plurality of data input and data output terminals which input and output the data to said control unit;

a write enable signal input terminal which is connected to said control unit and to which a write enable signal for permitting writing of the data is applied; and a plurality of control signal input terminals to each of which a cell clear signal for clearing the data store in said specific selectable memory cell is applied, whereby data reading, data writing and data clearing are performed through said plurality of data lines and said plurality of address lines.

2. A semiconductor memory circuit comprising:

a plurality of registers each having a plurality of memory cells arranged in an array form;

a plurality of data lines for reading data from and writing data in said plurality of memory cells;

a plurality of address lines which are connected respectively to said plurality of memory cells in said plurality of registers; each of said plurality of address lines being for transferring an address signal for specifying a corresponding specific memory cell in each of said registers;

a read/write control unit which controls reading and writing of the data in said plurality of memory cells;

a plurality of data input and data output terminals which input and output the data to said control unit;

a write enable signal input terminal which is connected to said control unit and to which a write enable signal for permitting writing of the data is applied;

a control signal input terminal to which a cell initialization signal for performing the initialization of the data in all of said plurality of all memory cells is applied;

a plurality of OR gates corresponding to the number of said plurality of memory cells in each of said registers, each of said plurality of OR gates receiving at one input terminal said address signal and at another input terminal said cell initialization signal, said plurality of OR gates being responsive to said initialization signal to select all of said plurality of memory cells to receive said input data from said read/write control unit through said data lines to thereby be initialized simultaneously; and whereby data reading, data writing and data initializing are performed through said plurality of data lines and said plurality of address lines.

3. A semiconductor memory circuit according to claim 1, in which each of said memory cell comprises:

a latch circuit formed by two inverters connected in parallel in an opposite direction; and a first and second switching transistors whose source-drain passages are connected between said latch circuit and said plurality of data lines, respectively, and whose gate terminals are connected to said address line, said latch circuit being selectively connected or disconnected to said plurality of data lines through said first and second switching transistors.

4. A semiconductor memory circuit according to claim 2, in which each of said memory cells comprises:

a latch circuit formed by two inverters connected in parallel and in an opposite direction from one another; and first and second switching transistors whose source-drain passages are connected between said latch circuit and said plurality of data lines, respectively, and whose gate terminals are connected to said address line, said latch circuit being selectively connected or disconnected to said plurality of data lines through said first and second switching transistors.

* * * * *

UNITED STATES PATENT AND TRADEMARK OFFICE
CERTIFICATE OF CORRECTION

PATENT NO. : 5,402,381
DATED : March 28, 1995
INVENTOR(S) : Satoru Sonobe and Hideo Abe It is certified that error(s) appears in the above-identified patent and that said Letters Patent is hereby corrected as shown below:

Column 2, Line 29, delete "Q" and insert --$\overline{Q}$--.

Column 2, Line 36, delete "308" and insert --306--.

Column 4, Line 8, delete "708" and insert --706--.

Column 5, Line 19, delete "308" and insert --306--.

Signed and Sealed this

Twelfth Day of December, 1995

Attest:

Attesting Officer

BRUCE LEHMAN

*Commissioner of Patents and Trademarks*